US012563997B2

(12) United States Patent
Lin et al.

(10) Patent No.: US 12,563,997 B2
(45) Date of Patent: Feb. 24, 2026

(54) WARM WAFER AFTER ION CRYO-IMPLANTATION

(71) Applicant: Taiwan Semiconductor Manufacturing Co., Ltd., Hsinchu (TW)

(72) Inventors: Yu-Chang Lin, Hsinchu (TW); Tien-Shun Chang, New Taipei (TW); Chun-Feng Nieh, Hsinchu (TW); Huicheng Chang, Tainan (TW); Yee-Chia Yeo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 707 days.

(21) Appl. No.: 16/934,762

(22) Filed: Jul. 21, 2020

(65) Prior Publication Data

US 2022/0028707 A1     Jan. 27, 2022

(51) Int. Cl.
H01L 21/67          (2006.01)
H01L 21/265         (2006.01)

(52) U.S. Cl.
CPC ...... H01L 21/67098 (2013.01); H01L 21/265 (2013.01); H01L 21/67196 (2013.01); H01L 21/67213 (2013.01); H01L 21/67248 (2013.01); *H01L 21/67207* (2013.01)

(58) Field of Classification Search
CPC ........ H01L 21/2633; H01L 2224/03632; H01J 37/3171
See application file for complete search history.

(56)                References Cited

U.S. PATENT DOCUMENTS

| | | | | |
|---|---|---|---|---|
| 5,134,301 | A | * | 7/1992 | Kamata ................. H01J 37/026 257/E21.334 |
| 5,244,820 | A | * | 9/1993 | Kamata ................. H01L 21/265 257/E21.336 |
| 5,895,923 | A | * | 4/1999 | Blake ................ H01L 21/67069 250/492.21 |
| 2003/0001528 | A1 | * | 1/2003 | Joo ......................... H01J 37/18 315/502 |
| 2004/0099651 | A1 | * | 5/2004 | Johnson ............ H01L 21/67115 219/390 |
| 2007/0173076 | A1 | * | 7/2007 | Kim .................... F16K 31/0675 438/800 |
| 2008/0044938 | A1 | * | 2/2008 | England ............ H01L 21/67248 438/51 |
| 2015/0221515 | A1 | * | 8/2015 | Ho .................... H01L 21/67745 438/530 |
| 2016/0284572 | A1 | * | 9/2016 | Jeong ................ H01L 21/67115 |

* cited by examiner

*Primary Examiner* — Thomas T Pham
(74) *Attorney, Agent, or Firm* — Slater Matsil, LLP

(57)                ABSTRACT

Embodiments of an ion cryo-implantation process utilize a post implantation heating stage to heat the implanted wafer while under the heavy vacuum used during cryo-implantation. The implanted wafer is then transferred to load locks which are held at a lesser vacuum than the heavy vacuum.

20 Claims, 10 Drawing Sheets

<u>100</u>

100

| | $t_1$ | $t_2$ | $t_3$ | $t_4$ | $t_5$ | $t_6$ | $t_7$ | $t_8$ | $t_9$ | $t_{10}$ | $t_{11}$ | $t_{12}$ | $t_{13}$ | $t_{14}$ | $t_{15}$ | $t_{16}$ | $t_{17}$ |
|---|---|---|---|---|---|---|---|---|---|---|---|---|---|---|---|---|---|
| $W_1$ | 160 | 150 | 170 | 150 | 140 | 150 | 180 | 150 | 190 | | | | | | | | |
| $W_2$ | | | 160 | 150 | 170 | 150 | 140 | 150 | 180 | 150 | 190 | | | | | | |
| $W_3$ | | | | | 160 | 150 | 170 | 150 | 140 | 150 | 180 | 150 | 190 | | | | |
| $W_4$ | | | | | | | 160 | 150 | 170 | 150 | 140 | 150 | 180 | 150 | 190 | | |
| $W_5$ | | | | | | | | | 160 | 150 | 170 | 150 | 140 | 150 | 180 | 150 | 190 |
| $W_6$ | | | | | | | | | | | 160 | 150 | 170 | 150 | 140 | 150 | 180 |
| $W_7$ | | | | | | | | | | | | | 160 | 150 | 170 | 150 | 140 |
| $W_8$ | | | | | | | | | | | | | | | 160 | 150 | 170 |

Fig. 6

| | $t_{m-10}$ | $t_{m-9}$ | $t_{m-8}$ | $t_{m-7}$ | $t_{m-6}$ | $t_{m-5}$ | $t_{m-4}$ | $t_{m-3}$ | $t_{m-2}$ | $t_{m-1}$ | $t_m$ |
|---|---|---|---|---|---|---|---|---|---|---|---|
| $W_{n-5}$ | 190 | | | | | | | | | | |
| $W_{n-4}$ | 180 | 150 | 190 | | | | | | | | |
| $W_{n-3}$ | 140 | 150 | 180 | 150 | 190 | | | | | | |
| $W_{n-2}$ | 170 | 150 | 140 | 150 | 180 | 150 | 190 | | | | |
| $W_{n-1}$ | 160 | 150 | 170 | 150 | 140 | 150 | 180 | 150 | 190 | | |
| $W_n$ | | | 160 | 150 | 170 | 150 | 140 | 150 | 180 | 150 | 190 |

Fig. 7

WARM WAFER AFTER ION CRYO-IMPLANTATION

BACKGROUND

Integrated circuits comprising semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon. A series of chemical and physical processes may be performed during the fabrication process flow, using equipment with processing chambers that are often maintained at low pressure or partial vacuum.

The integrated circuit industry continues to improve the integration density of various electronic components (e.g., transistors, diodes, resistors, capacitors, etc.) by continual reductions in minimum feature size, which allow more components to be integrated into a given area, thereby lowering the cost of integrated circuits. Maintaining a continual reduction in manufacturing cost requires a high efficiency integrated circuit fabrication facility and infrastructure that may give rise to additional problems that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5 through 7 illustrate sequence diagrams, in accordance with some embodiments.

DETAILED DESCRIPTION

Figure 1:
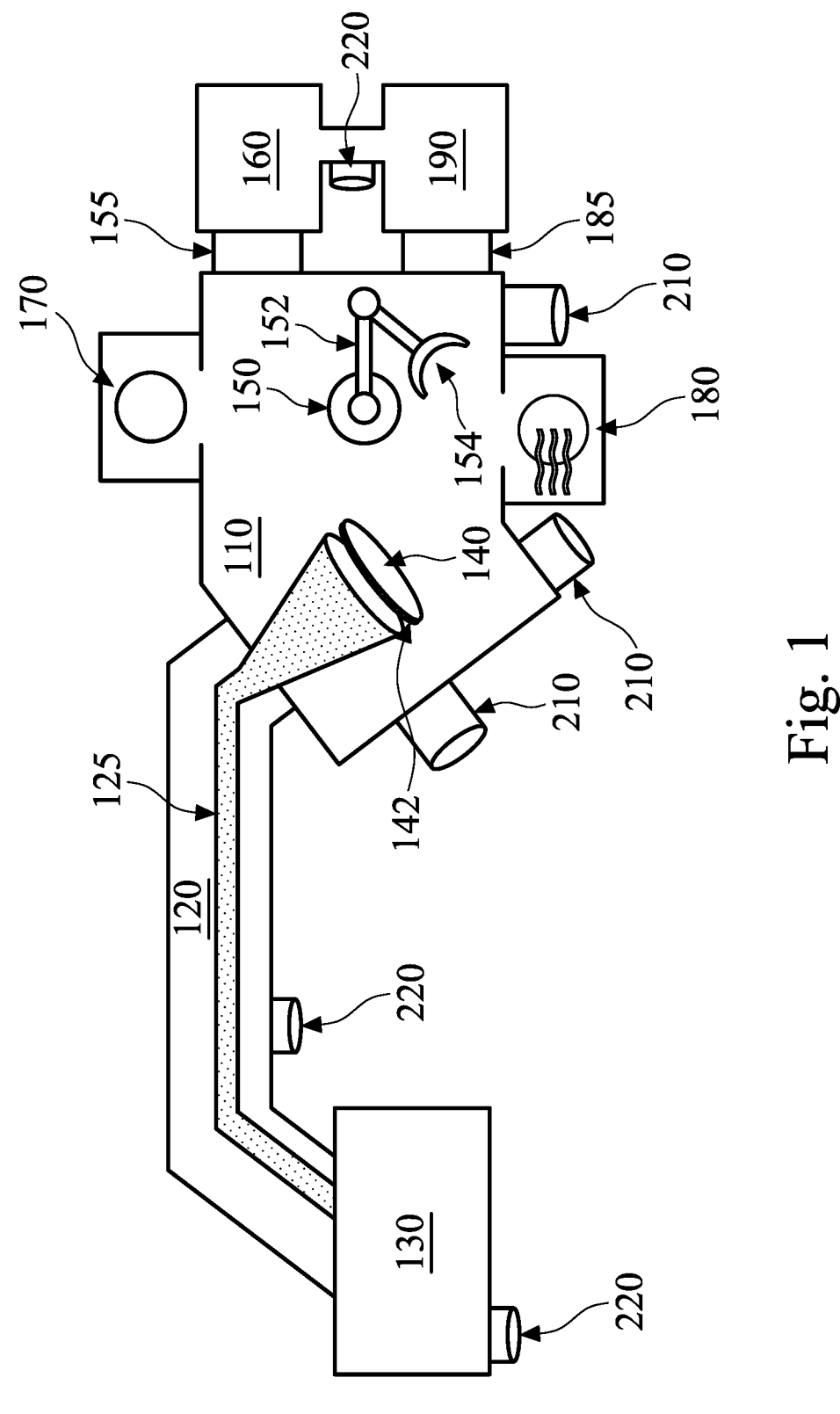
FIG. 1 illustrates a diagram of an implantation device and chamber, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments eliminate potential contamination from condensation which can develop after an ion cryo-implantation process. The cryo-implantation process is performed under heavy vacuum while a lesser vacuum is maintained in the incoming and outgoing load locks of the implantation system. Rather than heat the wafers back to a target post-processing temperature in the outgoing load lock where condensation can form on the implanted wafers when subjected to the lesser vacuum level, the wafers are heated back to the target post-processing temperature in a heating stage which is attached to the implantation system and has the same vacuum as the implantation system. As a result, contamination which can result from condensation is eliminated or reduced and wafer-to-wafer consistency and stability is increased.

FIG. 1 illustrates a wafer implantation apparatus 100, in accordance with embodiments. The wafer implantation apparatus 100 may be used to perform an ion cryo-implantation into a wafer of any suitable size, for example 300 mm, though other sizes may be used and are contemplated. The wafer implantation apparatus 100 includes a processing chamber 110 where ion implantation occurs. The wafer implantation apparatus 100 may include an ion implantation mechanism 120, ion source 130, and wafer handling unit 140. The ion implantation mechanism 120 may include a mass analysis magnet, a linear accelerator, a convergence unit, and an aperture which provides ions to an end station which includes the wafer handling unit 140.

The ion source 130 produces an ion beam from a selected species for implantation. The selected species may be any desired element or compound which is suitable for a particular purpose. For example, the species may be a p-type species, including boron, indium, gallium, fluoroboron (e.g., difluoroboron), and so forth, an n-type species, such as phosphorous, arsenic, antimony, phosphyne (e.g., diphosphyne), and so forth, or a conductively neutral species, such as nitrogen, carbon, fluorine, and so forth. The species is directed towards the mass analysis magnet in order to electromagnetically separate those ions having a desired charge-to-mass ratio for implantation from those ions having an undesired charge-to-mass ratio. Once a coherent ion beam of suitable charge-to-mass ratio is obtained, the coherent ion beam 125 is sent to the linear accelerator.

The linear accelerator is used to impart additional energy to the coherent ion beam 125 as it passes through the linear accelerator. The linear accelerator imparts this additional energy using a series of electrodes that generate an electromagnetic field which, when the coherent ion beam 125 passes through the field, works to accelerate the coherent ion beam 125. The linear accelerator may vary the electromagnetic fields periodically with time or may adjust the phase of the electromagnetic fields to accommodate ions with different atomic numbers as well as ions having different initial speeds.

After the coherent ion beam 125 is passed through the linear accelerator, the coherent ion beam 125 is passed through the converging unit, which is utilized to modify the convergence and divergence of the coherent ion beam 125 (which arrives from the linear accelerator as a substantially parallel beam). The converging unit may include one or more lenses or apertures to focus or spread the coherent ion beam 125 according to a desired implantation process. The coherent ion beam 125 may then be directed to the end unit, including the wafer handling unit 140, and a wafer 142 provided in the wafer handling unit 140. The coherent ion beam 125 may be directed to a desired implantation location of the wafer 142, including a portion of the wafer 142, or the entire wafer 142. The wafer handling unit 140 may be utilized to move the wafer 142 in relation to the coherent ion beam 125 so as to illuminate different implantation areas of the wafer 142 with the coherent ion beam 404 and/or to hold the wafer 142 at various angles to the coherent ion beam 125 so as to provide an angled implantation of ions into the wafer 142. For example, the wafer handling unit 140 may include motors which may be used to control the position of the wafer 142 in at least two directions, such as an x-direction and a y-direction, relative to the coherent ion beam 125.

The wafer handling unit 140 may include an implantation platen having an electrostatic chuck to securely hold the wafer 142 during implantation. In addition, the wafer handling unit 140 may include cooling features to keep the wafer 142 cold during the implantation process. For example, in some embodiments, the wafer handling unit 140 may keep the wafer 142 at a temperature between −100° C. and about −30° C., such as about −60° C.

The wafer implantation apparatus 100 includes a robot 150 which may include an articulated arm 152 and wafer transfer mechanism 154. The robot 150 can move wafers, such as wafer 142, within the wafer implantation apparatus 100 from station to station. Such stations include the wafer handling unit 140, an incoming load lock 160, cooling stage 170, heating stage 180, and an outgoing load lock 190.

The incoming load lock 160 is separated from the processing chamber 110 by a slit valve 155. The slit valve 155 allows the robot 150 to access wafers positioned in the incoming load lock 160 while keeping the atmosphere of the processing chamber 110 separate from the atmosphere of the incoming load lock 160. The slit valve 155 may be opened to retrieve a wafer and may be in a closed state before and after the wafer is being retrieved. The slit valve 155 allows for two different vacuum levels to be maintained between the incoming load lock 160 and the processing chamber 110. In some embodiments, the incoming load lock 160 may hold a plurality of wafers for ion implantation. For example, the incoming load lock 160 may include a wafer holder (or wafer boat) which includes between one and twenty-six wafer slots, though any number of wafer slots is contemplated and may be used.

The cooling stage 170 may include a platform for holding a wafer and cooling the wafer to the desired implantation temperature prior to performing the implantation. The cooling stage 170 is attached to the processing chamber 110 and maintained at the same vacuum as the processing chamber 110. In other words, there is no valve between the processing chamber 110 and the cooling stage 170.

After implantation, the heating stage 180 is used to heat the wafer to room temperature or to the ambient temperature of the outgoing load lock 190. The heating stage 180 may include a platform for holding a wafer and heating the wafer to the desired temperature after performing the implantation. The heating stage 180 is attached to the processing chamber 110 and maintained at the same vacuum as the processing chamber 110. In some embodiments, there is no valve between the processing chamber 110 and the heating stage 180. In other embodiments, a slit valve may be between the processing chamber 110 and the heating stage 180, such as the valve 175 illustrated in FIG. 3. The heating stage 180 is described in greater detail below with respect to FIGS. 2 and 3.

After a wafer is heated on the heating stage 180, the wafer can be transferred to the outgoing load lock 190. A slit valve 185 may separate the outgoing load lock 190 from the processing chamber 110. The slit valve 185 allows the robot 150 to provide processed wafers into the outgoing load lock 190. The slit valve 185 may be opened to transfer a wafer from the processing chamber 110 to the outgoing load lock 190 and may be closed before and after the wafer is being transferred. The slit valve 185 allows for two different vacuum levels to be maintained between the outgoing load lock 190 and the processing chamber 110. In some embodiments, the outgoing load lock 190 may hold a plurality of wafers after ion implantation. For example, the outgoing load lock 190 may include a wafer holder (or wafer boat) which includes between one and thirty wafer slots, though any number of wafer slots is contemplated and may be used. The incoming load lock 160 and outgoing load lock 190 may hold the same number of wafers or a different number of wafers.

FIG. 1 also illustrates a plurality of vacuum pumps attached to the wafer implantation apparatus 100. Cryo vacuum pumps 210 are capable of maintaining a vacuum of $1e^{-6}$ torr. Turbo vacuum pumps 220 are capable of maintaining a vacuum of $1e^{-4}$ torr. The gap of the vacuum level of the outgoing load lock 190 to the processing chamber 110 is about 2 to 3 orders of magnitude greater, or in other words 100 to 1000 times the vacuum level of the processing chamber 110. Multiple cryo vacuum pumps 210 and multiple turbo vacuum pumps 220 may be used to achieve a vacuum level quicker in the wafer implantation apparatus 100 than would be achieved with a single vacuum pump. For example, in some embodiments one, two, or three cryo vacuum pumps 210 may be used for bringing the vacuum level of the processing chamber 110 below $1e^{-4}$ torr down toward $1e^{-6}$ torr. The more pumps in use the quicker the processing chamber 110 recovers from losses in vacuum from the opening of slit valve 155 or slit valve 185. As illustrated in FIG. 1, the ion implantation mechanism 120, ion source 130, incoming load lock 160, and outgoing load lock 190 may utilize turbo vacuum pumps 220 to provide vacuum to these areas which are not as great as vacuum in the processing chamber 110.

Figure 2:
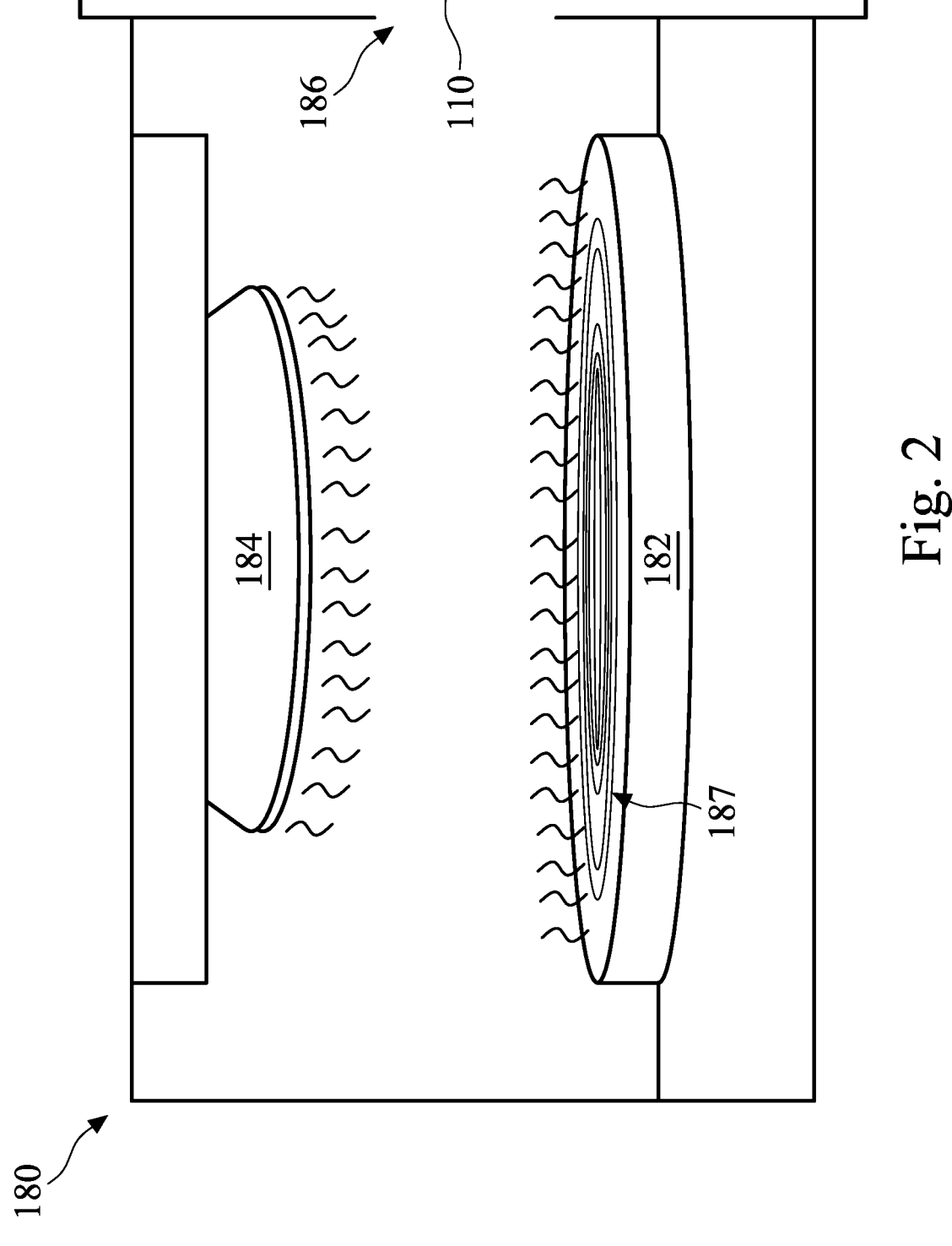
FIGS. 2 and 3 illustrate diagrams of a heating stage of an implantation device, in accordance with some embodiments.

FIG. 2 illustrates heating stage 180 in greater detail, in accordance with some embodiments. As illustrated in FIG. 2, the heating stage 180 is attached to the processing chamber 110 with an opening between the processing chamber 110 and the heating stage 180. This opening provides that the vacuum level is the same in the processing chamber 110 and in the heating stage 180. The heating stage 180 provides a platform 182 which may hold a wafer, such as wafer 142 during the post-implantation heating process. In some embodiments, the platform 182 may, itself, be heated by heating elements 187, as indicated by the wavy lines coming from the surface of the platform 182. The heating elements 187 in the platform 182 may include electric heating coils or liquid heating loops circulating a heated liquid through the platform 182. In some embodiments a heater 184, such as a heat lamp or coil heater, may also or instead be provided to provide heat to an upper surface of the wafer 142 during the post-implantation heating process. The platform 182 and/or heater 184 may be used in conjunction to heat the wafer up to ambient temperature of the outgoing load lock 190, which may be between 0° C. and 50° C., such as room temperature, or about 20° C. to about 27° C. In some embodiments, the wafer may be heated to within 10-15° C. of the ambient temperature of the outgoing load lock 190.

The heating process advantageously brings the wafer 142 up to the ambient temperature of the outgoing load lock 190 while under the heavy vacuum of the processing chamber 110. Rather than heat the wafer 142 in the outgoing load lock under the lighter vacuum level, heating the wafer 142 under the heavy (and same) vacuum of the processing chamber 110 substantially eliminates condensation from forming on the surface of the wafer 142. Condensation forms when moisture in the air condenses on an element in the environment which is colder than the surrounding elements and colder than the condensation point of the moisture. For example, if the ambient temperature of an environment is 25° C. and the pressure is between $1e^{-4}$ torr and $1e^{-3}$ torr, the condensation point is greater than the working temperature of the wafer for cryo implantation, causing condensation to form on the surface of the wafer. For example, the working temperature of the wafer may be about –60° C., while the condensation temperature at a pressure of about $1e^{-4}$ torr may be between –60° C. and –40° C. Condensation will therefore form on any object in the environment that has a surface temperature less than the condensation temperature.

To prevent condensation from forming on the wafer 142 during ion implantation when the wafer 142 is at –60° C., it is under the heavy vacuum provided by the cryo vacuum pumps 210. As a result of the heavy vacuum, the moisture content in the processing chamber 110 is substantially zero, driving the condensation temperature in the processing chamber to below –100° C., such as between about –150° C. to about –170° C., such as about –160° C. But, if the wafer were to be transferred to the lower vacuum (higher pressure) outgoing load lock 190 while still cold (at or near implantation temperature) and then warmed in the outgoing load lock 190, the moisture in the outgoing load lock 190 (which is held at a lesser vacuum level) would condense onto the wafer 142. In particular, the condensation temperature in the outgoing load lock 190 may be between about –60° C. and about –40° C. while the outgoing load lock 190 pressure is between about $10^{-4}$ and $10^{-3}$ torr. When the outgoing load lock 190 is vented and the pressure returns to 1 atm, the condensation temperature is about 0° C. In either case, one or more wafers in the outgoing load lock 190 may have condensation form because the condensation temperature is greater than the working implantation temperature. This resulting condensation may react with certain implanted species and may also attract particles to adhere to the front side of the wafer. For example, where phosphorous is implanted, condensation water may react with the phosphorous to produce phosphorous pentoxide ($10H_2O+ P_4 \rightarrow P_4O_{10}+10H_2$). The condensation may also attract particulate materials to stick to the wafer 142.

FIG. 2 also illustrates that the heating stage 180 is separated from the processing chamber 110 by an opening 186. The opening 186 allows access to the heating stage 180 by the robot 150 (see FIG. 1) to insert and remove the wafer 142 from the platform 182. Because the opening 186 remains open during processing of the wafers (i.e., cooling, implantation, heating, etc.) the vacuum pressure of the heating stage 180 is continuous with the vacuum pressure of the processing chamber 110.

Figure 3:
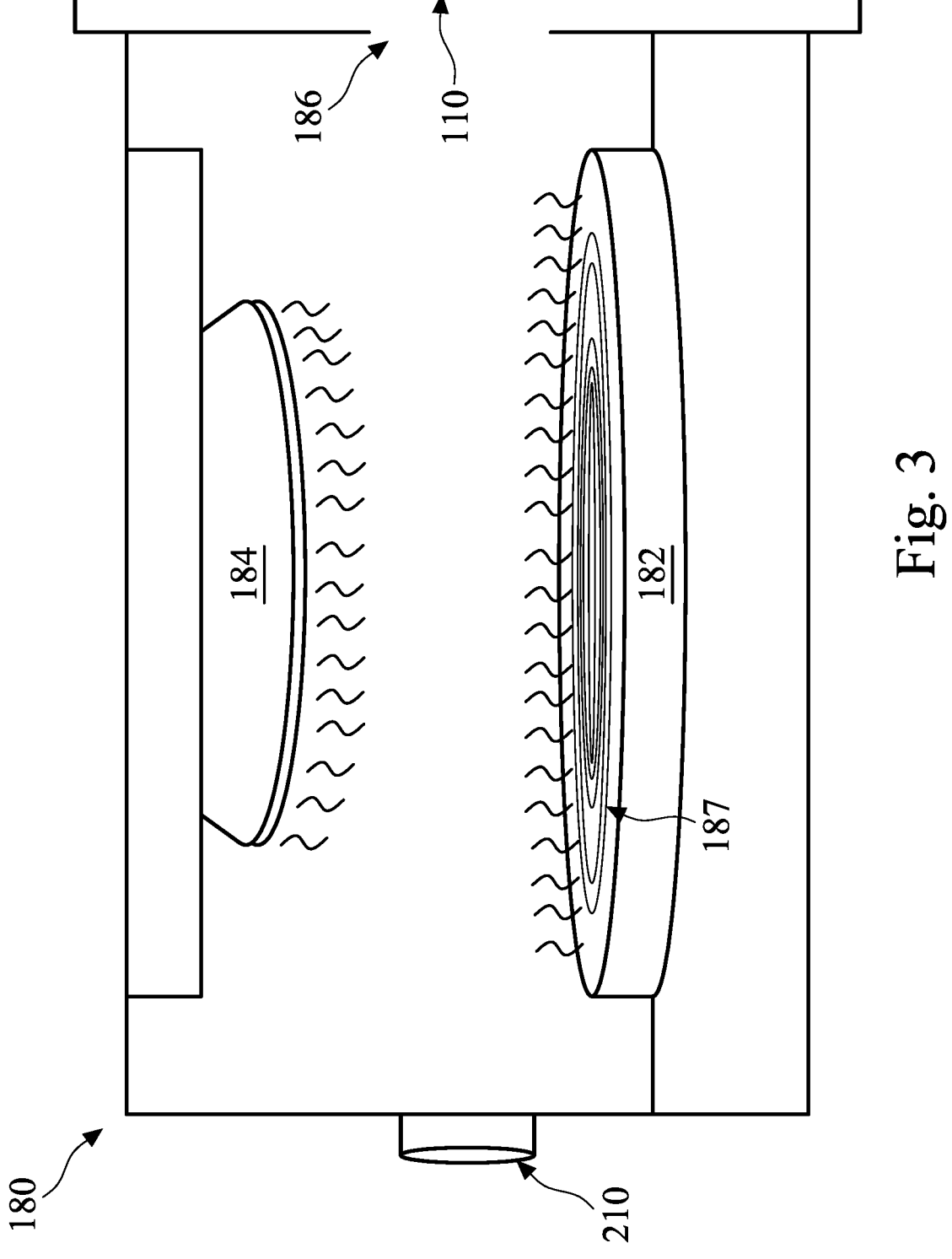

FIG. 3 illustrates that an additional cryo vacuum pump 210 may be mounted to the heating stage 180, in accordance with some embodiments. The additional cryo vacuum pump 210 provides better vacuum level stability in the processing chamber 110 when the slit valve 155 or slit valve 185 is opened to access the incoming load lock 160 or outgoing load lock 190.

Figure 4:
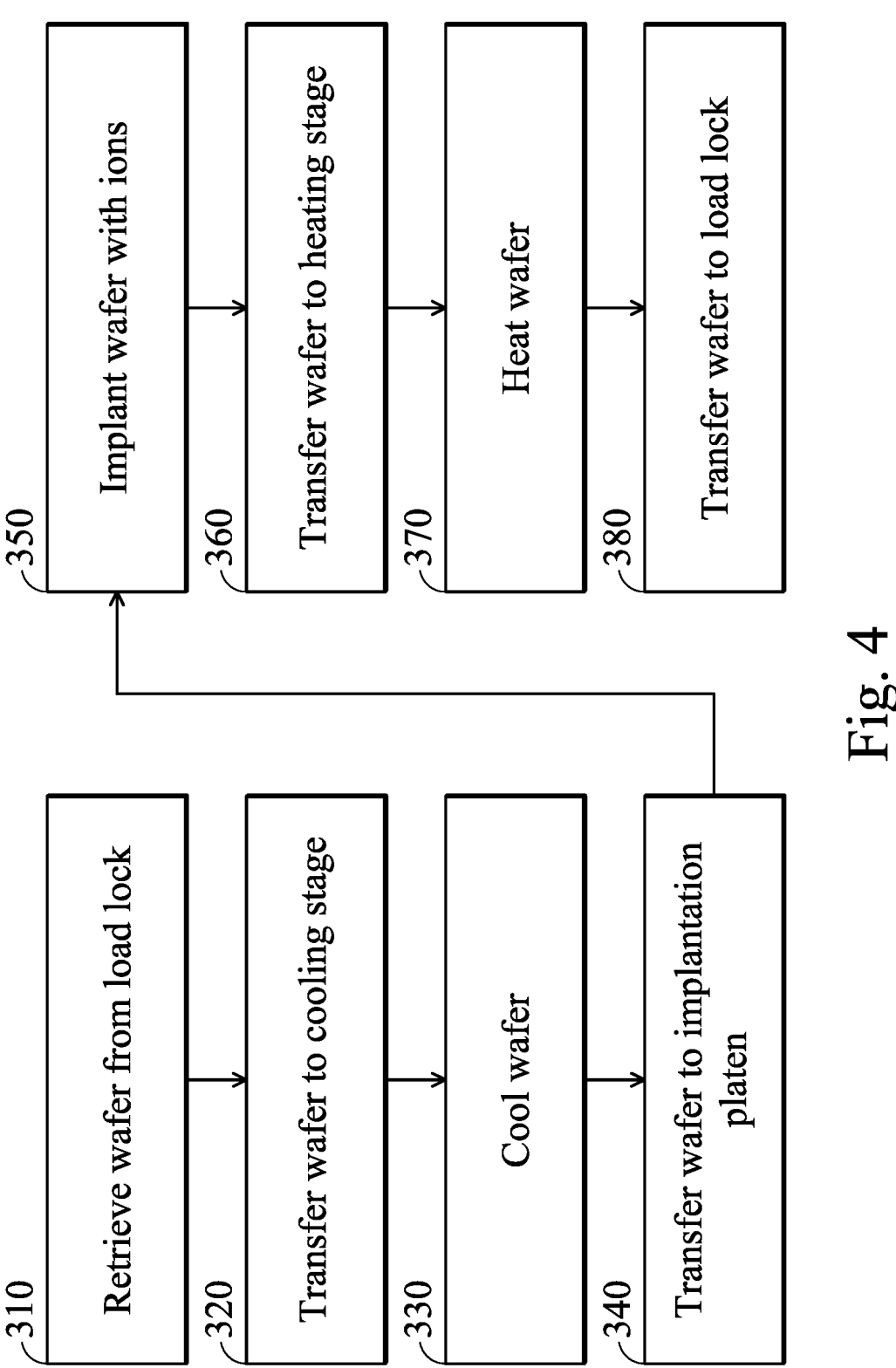
FIG. 4 illustrates a flow diagram of an implantation process, in accordance with some embodiments.

FIG. 4 illustrates a flow diagram for a cryo implantation process, in accordance with some embodiments. At process 310 a wafer, such as wafer 142, is retrieved from the incoming load lock 160. As noted above, the wafer 142 may be housed in a wafer boat located in the incoming load lock 160. The wafer boat in the incoming load lock 160 may be unloaded and loaded by another robot outside the implantation apparatus. The wafer 142 may be retrieved through a slit valve 155. The slit valve 155 allows for the vacuum level in the processing chamber 110 to be minimally influenced by the different vacuum level in the incoming load lock 160.

At process 320, the wafer 142 is transferred to the cooling stage 170 to precool the wafer 142 to the target implantation temperature. At process 330, the wafer is cooled to the target implantation temperature which is a deep freezing level between –100° C. and –30° C., such as about –60° C. A cryo implantation of ions at deep freezing levels is an effective tool to enhance device performance. The cooling may be accomplished by placing the wafer on a cooling platform and circulating a cryogenic liquid through the cooling platform. Such cryogenic liquids include, for example, liquid argon, liquid helium, liquid hydrogen, liquid nitrogen, and liquid oxygen. In some embodiments, a cryogenic liquid may also or instead be sprayed onto the wafer 142. The wafer 142 may be placed on the cooling platform and cooled for a duration between about 60 sec and about 180 sec. Once the wafer 142 reaches the implantation temperature, the cooling platform may maintain the wafer 142 at the implantation temperature until the wafer 142 is moved to the wafer handling unit 140 for implantation.

At process 340, the wafer is transferred to the implantation platen of the wafer handling unit 140. At process 350, the wafer 142 is implanted with ions using an implantation process. The purpose for the implantation process may be for any suitable purpose. For example, the implantation process may be used to form amorphous regions in a crystalline structure or provide doped areas of a semiconductor substrate or other regions, such as ultra-shallow junctions, doped wells, or source/drain regions, though these are not intended to be limiting. The implantation process may target the entire wafer 142 or particular regions of the wafer 142 using lenses, masks, reticles, or the like. The implantation platen of the wafer handling unit 140 may include cooling features, such as a circulation system to circulate a cryogenic liquid, to keep the wafer 142 at the target implantation temperature during the implantation process. The implantation process may have a duration between about 120 sec and about 240 sec, though other values are contemplated and may be used.

At process 360, the wafer 142 is transferred to the heating stage 180 through an opening 186 between the heating stage 180 and the processing chamber 110. At process 370, the wafer 142 is heated to a target temperature. In some embodiments, the target temperature may be the same as the ambient temperature of the processing chamber 110 or the ambient temperature of the outgoing load locks 190. In some embodiments, the target temperature may be greater than the condensation temperature of the outgoing load locks 190, but less than an annealing temperature which would activate implanted dopants or recrystallize amorphous regions of the implanted regions. In some embodiments, the target temperature may be between about 20° C. and about 50° C. In some embodiments, the ambient temperature of the outgoing load locks 190 may be about room temperature, and may be between about 20° C. and 27° C. The wafer 142 may be heated by applying heat to the wafer through the heater 184 poised over the wafer 142 and/or through heating elements 187 disposed in the platform 182 of the heating stage 180. The wafer 142 may be placed on the platform 182 and heated for a duration between about 10 sec and about 30 sec. Once the wafer 142 reaches the target temperature, the platform 182 and heater 184 may maintain the wafer 142 at the target temperature until the wafer 142 is moved to the outgoing load lock 190.

At process 380, the wafer 142 is transferred to the outgoing load lock 190. The wafer 142 provides the wafer 142 through the slit valve 185 to a wafer boat in the outgoing load lock 190 which may be unloaded by another robot outside the wafer implantation apparatus 100. The slit valve 185 allows for the vacuum level in the processing chamber 110 to be minimally influenced by the different vacuum level in the outgoing load lock 190 by reducing the amount of pressure leakage from the higher pressure (lower vacuum) outgoing load lock 190 to the lower pressure (higher vacuum) processing chamber 110.

Figure 5:
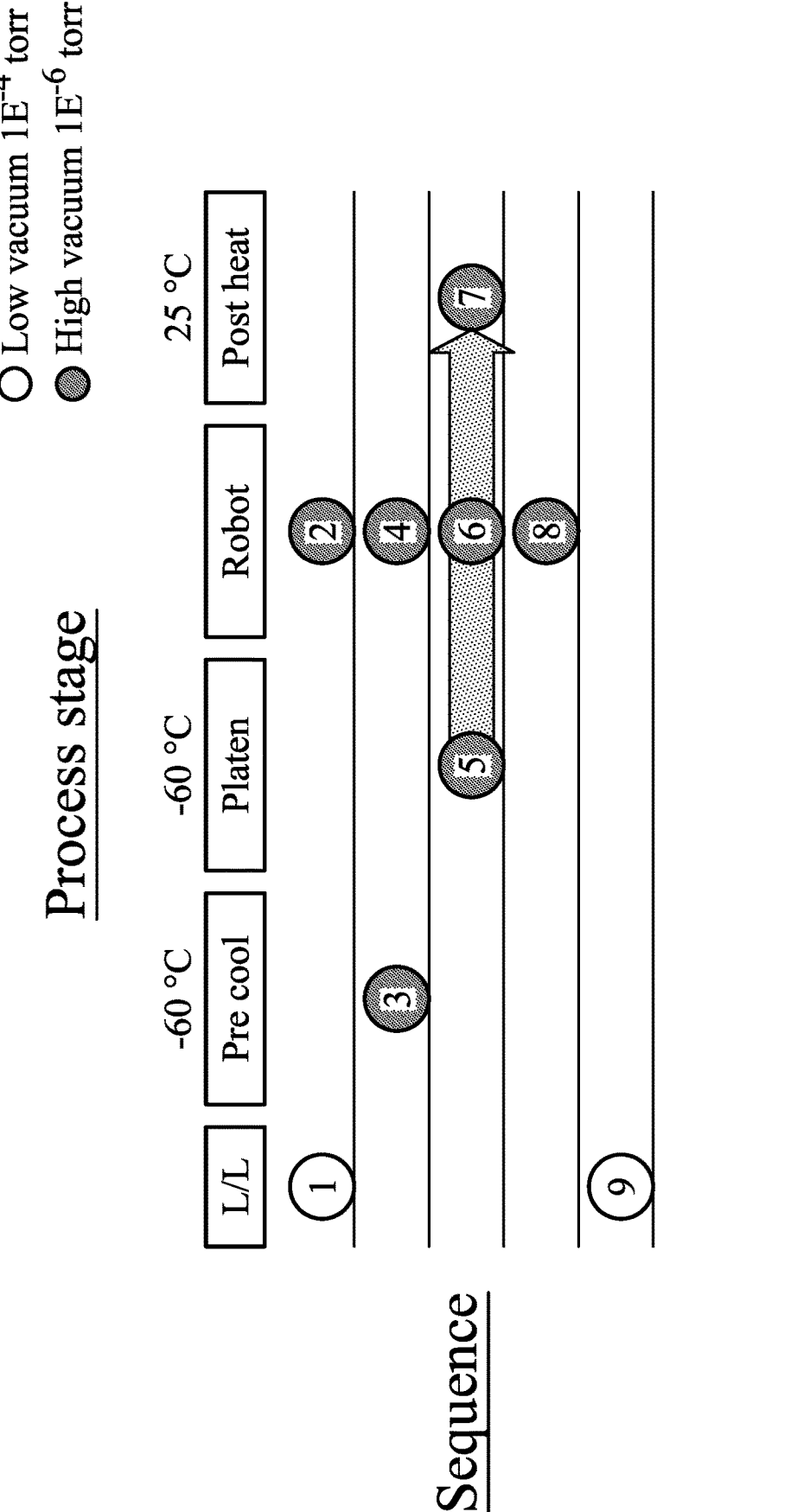

FIG. 5 provides a sequence graph which follows a single wafer through an ion cryo-implantation process, in accordance with some embodiments. The light colored circles indicate a low vacuum level, such as about $1e^{-4}$ torr and the dark colored circles indicate a high vacuum level, such as about $1e^{-6}$ torr. First the wafer 142 is in the incoming load lock 160. Then the wafer 142 is manipulated by the robot 150 into cooling stage 170 to precool the wafer to the implantation temperature. Next, the wafer 142 is manipulated by the robot 150 onto the wafer handling unit 140 for ion implantation. Next, the wafer 142 is manipulated by the robot 150 into the heating stage 180 for post implantation heating of the wafer 142. Finally, the wafer 142 is manipulated by the robot 150 into the outgoing load lock 190 which is at the lower vacuum level. Once the wafer 142 is in the outgoing load lock 190, another robot (not shown) in another part of the system may move the wafer 142 to another portion for further processing. If the outgoing load lock 190 holds multiple wafers, for example, in a wafer boat, when the wafer boat is full the entire wafer boat may be removed and replaced with an empty wafer boat, for example, from the incoming load lock 160. If the outgoing load lock 190 holds one wafer, the then wafer 142 may be transferred out of the outgoing load lock 190 prior to another wafer being moved into the outgoing load lock 190.

FIG. 6 illustrates the sequence represented by FIG. 5 in a stepped format for multiple wafers. As noted above, rather than heat the wafer 142 in the outgoing load lock 190, the wafer 142 is heated in a separate heating stage 180. But this added stage does not negatively affect wafer throughput over the long run. The chart in FIG. 6 has time slots referenced across the top of the chart and wafer numbers referenced down the side of the chart. The wafers are processed one at a time through the sequence illustrated in FIG. 5 as illustrated in FIG. 6. Rather than process each wafer individually, however, multiple wafers may be processed at the same time at the different stations of the processing chamber 110. Each of the time slots $t_1$ through $t_{17}$ may be between about 180 sec and about 3600 sec in length. In some embodiments, each time slot is the same length of time, while in other embodiments, each of the time slots need not be the same as one another. For example, the length of the time slot $t_2$ may be shorter than the length of the time slot $t_4$ since the robot 150 only needs to perform one action in the time slot $t_2$. Also, the length of the time slot $t_8$ may be shorter or longer than the length of the time slot $t_9$. The length of the time slot $t_9$ may be determined by the action which takes the longest between the cooling stage 170, the implantation at the wafer handling unit 140, or the heating stage 180. In some embodiments, wafer handling outside the processing chamber 110, e.g., loading or unloading the wafer from the incoming load lock 160 or outgoing load lock 190 by an external robot may take the longest time in a particular time slot.

Wafer $W_1$, at time $t_1$, is in the incoming load lock 160. At time $t_2$, wafer $W_1$ is transferred by the robot 150 into the cooling stage 170. At time $t_3$, wafer $W_1$ is cooled in the cooling stage 170 and wafer $W_2$ is in the incoming load lock 160. At time $t_4$, wafer $W_1$ is transferred by the robot 150 to the wafer handling unit 140 and wafer $W_2$ is transferred by the robot 150 to the cooling stage 170. At time $t_5$, wafer $W_1$ is implanted with ions at the wafer handling unit 140, wafer $W_2$ is cooled in the cooling stage 170, and wafer $W_3$ is in the incoming load locks 160. At time $t_6$, wafer $W_1$ is transferred by the robot 150 to the heating stage 180, wafer $W_2$ is transferred by the robot 150 to the wafer handling unit 140, and wafer $W_3$ is transferred by the robot to the cooling stage 170. At time $t_7$, wafer $W_1$ is heated in the heating stage 180, wafer $W_2$ is implanted with ions at the wafer handling unit 140, wafer $W_3$ is cooled in the cooling stage 170, and wafer $W_4$ is in the incoming load lock 160. At time $t_8$, wafer $W_1$ is transferred by the robot 150 to the outgoing load lock 190, wafer $W_2$ is transferred by the robot 150 to the heating stage 180, wafer $W_3$ is transferred by the robot 150 to the wafer handling unit 140, and wafer $W_4$ is transferred by the robot 150 to the cooling stage 170. At time $t_9$ wafer $W_1$ is in the outgoing load lock 190 (and may be removed from the outgoing load lock by another external process/robot), wafer $W_2$ is heated in the heating stage 180, wafer $W_3$ is implanted with ions at the wafer handling unit 140, wafer $W_4$ is cooled in the cooling stage 170, and wafer $W_5$ is in the incoming load lock 160. This process continues on until all the wafers are processed.

As noted in FIG. 6, all the moves of the robot 150 may be accomplished in one time slot. The time slots for robot 150 (e.g., $t_2$, $t_4$, $t_6$, $t_8$, $t_{10}$, $t_{12}$, etc.) may be shortened or lengthened as necessary to achieve all the movement required by the robot 150. Each wafer movement by the robot 150 may take between 30 sec and 60 sec, though other values may be used and are contemplated. In the illustrated embodiment, in each of these time slots, the robot 150 handles 4 wafers, for a total robot 150 time between 120 sec and 180 sec.

FIG. 7 illustrates the end of a run of n wafers in m time slots. At time $t_{m-6}$, wafer $W_{n-3}$ is in the outgoing load lock 190, wafer $W_{n-2}$ is heated in the heating stage 180, wafer $W_{n-1}$ is implanted with ions at the wafer handling unit 140, and wafer $W_n$ is cooled in the cooling stage 170. At time $t_{m-5}$, wafer $W_{n-2}$ is transferred by the robot 150 to the outgoing load lock 190, wafer $W_{n-1}$ is transferred by the robot 150 to the heating stage 180, and wafer $W_n$ is transferred by the robot 150 to the wafer handling unit 140. At time $t_{m-4}$, wafer $W_{n-2}$ is in the outgoing load lock 190, wafer $W_{n-1}$ is heated in the heating stage 180, and wafer $W_n$ is implanted with ions at the wafer handling unit 140. At time $t_{m-3}$, wafer $W_{n-1}$ is transferred to the outgoing load lock 190 and wafer $W_n$ is transferred to the heating stage 180. At time $t_{m-2}$, wafer $W_{n-1}$ is in the outgoing load lock 190 and wafer $W_n$ is heated in the heating stage 180. At time $t_{m-1}$, wafer $W_n$ is transferred to the outgoing load lock 190, and at time $t_m$, wafer $W_n$ is in the outgoing load lock 190.

Figure 8:
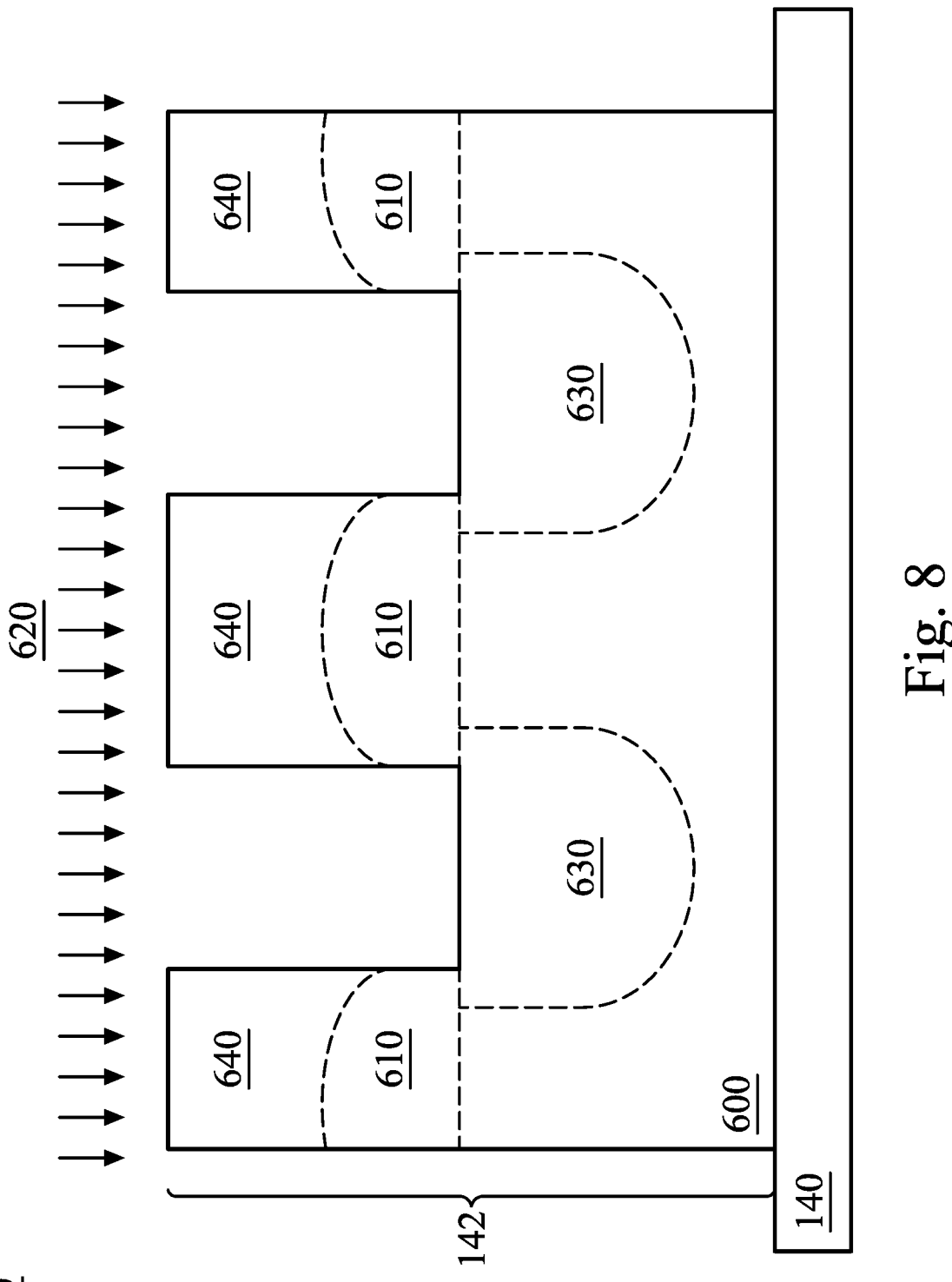
FIGS. 8 through 10 illustrate intermediate steps of an ion cryo-implantation process, in accordance with some embodiments.

FIG. 8 illustrates an example implantation process using the wafer implantation apparatus 100, in accordance with some embodiments. Wafer 142 includes a substrate 600. The wafer 142 is cooled in the cooling stage 170 and then moved to the wafer handling unit 140 in the processing chamber 110. An ion implantation process 620 implants ions into the substrate 600, forming implantation regions 630. In the illustrated embodiment, a mask 610 is over the substrate 600 and patterned to form openings corresponding to the implantation regions 630. Ions are also implanted in the mask 610, forming mask implant regions 640. The mask may be a photoresist mask which is patterned using acceptable photopatterning techniques or may be a hard mask which is formed by etching a hard mask layer through a corresponding photoresist mask.

In some embodiments, the substrate 600 may include a crystalline silicon substrate (e.g., wafer). The substrate 600 may be a p-type substrate, that is, substrate 600 may be doped with p-type dopants or an n-type substrate doped with n-type dopants. The implantation regions 630 may correspond to additional doped wells which are doped with ions of n-type or p-type dopants forming well regions comprising n-type doped wells and p-type doped wells depending on design requirements. In some embodiments, the substrate 600 may be a silicon on insulator (SOI) substrate. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 600 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The example of FIG. 8 is not intended to be limiting. In some embodiments, the substrate 600 may have devices formed thereon or portions of devices formed thereon. For example, in some embodiments, the substrate 600 may be a portion of a fin field-effect transistor (FinFET) and the ion implantation process 620 corresponds to the formation of lightly doped regions under a gate structure, corresponds to doped source/drain regions, or the like.

Figure 9:
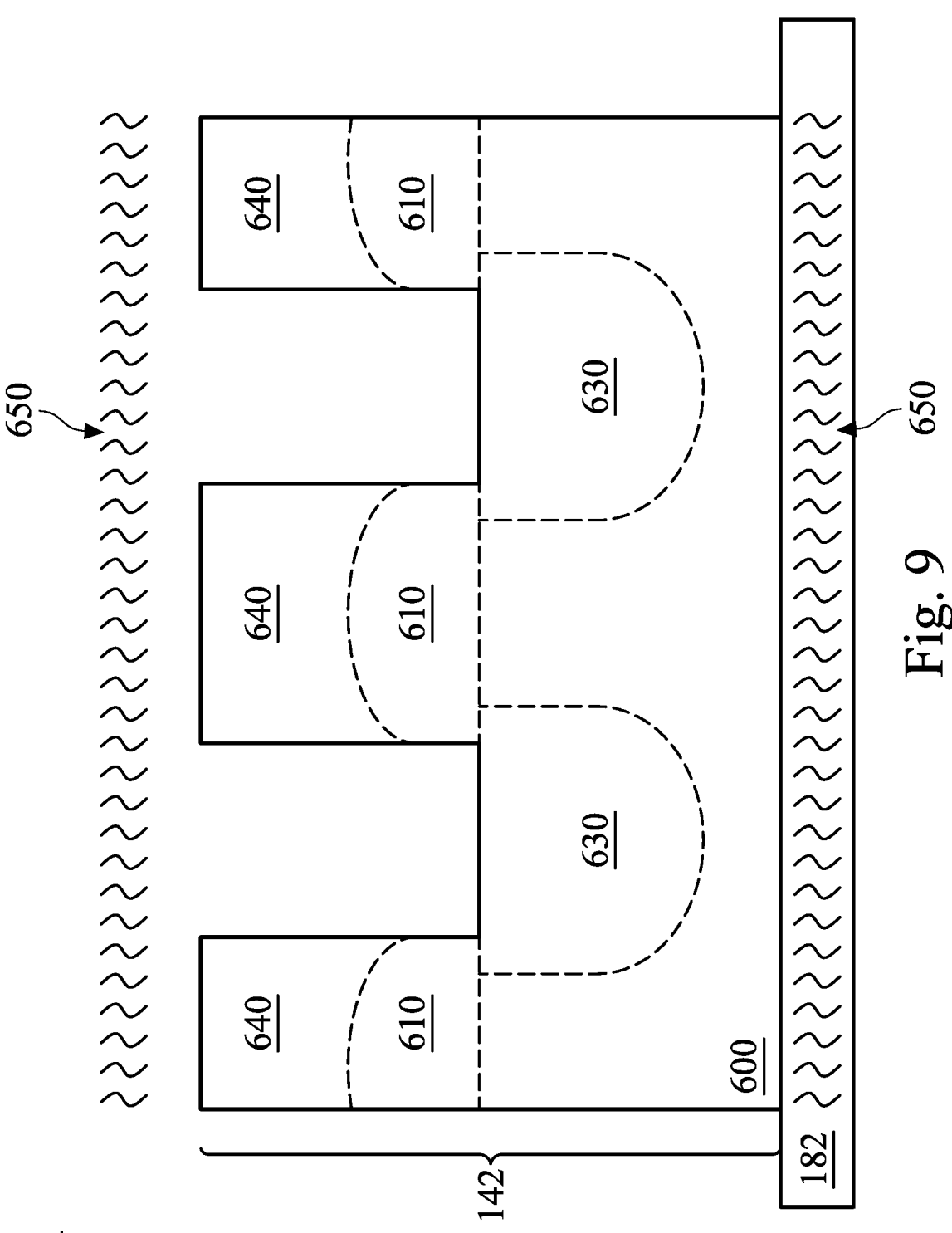

In FIG. 9, the wafer 142 is moved to the platform 182 of the heating stage 180 for a post-implantation heating process 650 while under the heavy vacuum of the processing chamber 110 and while the vacuum of the outgoing load lock 190 is about 100 times less than the vacuum of the processing chamber 110. Because the wafer 142 is heated under the heavy vacuum of the processing chamber 110, the wafer remains condensation free during the post implantation heating in the heating stage 180. And because the wafer remains condensation free during the post implantation heating, the implanted ions do not react with condensation water and the material of the substrate 600 does not react with condensation water.

Figure 10:
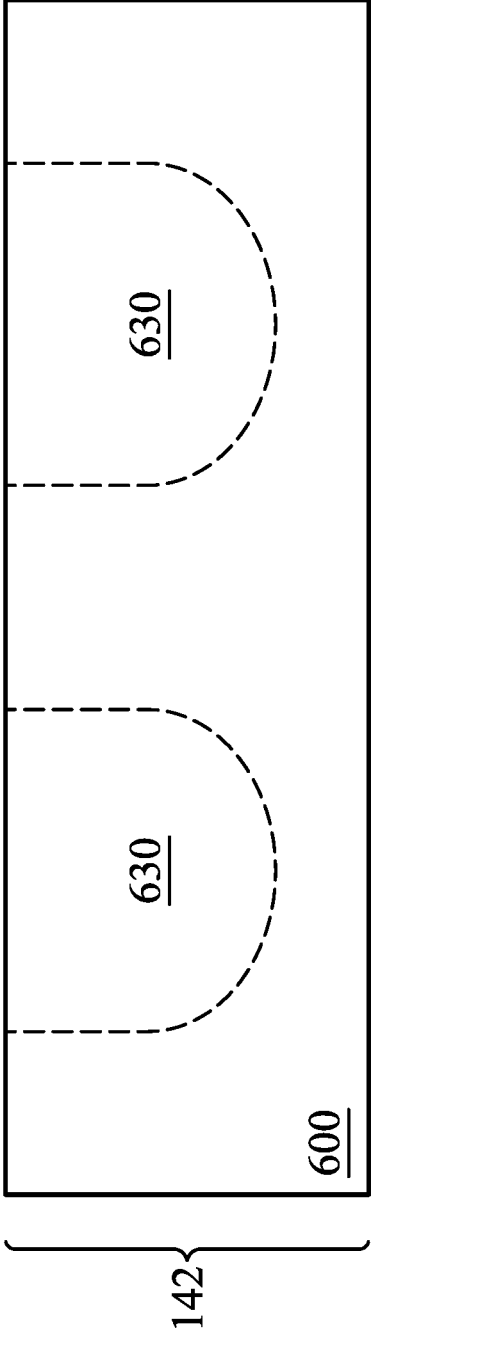

In FIG. 10, after the wafer 142 is transferred to the outgoing load lock 190, the wafer is further processed to remove the mask 610 and mask implant regions 640. The mask 610 may be removed by any suitable process, such as by an acceptable ashing process, etching process, or by a polishing process, such as a chemical mechanical polishing (CMP) process.

Embodiments advantageously utilize a new heating stage attached to the implantation processing chamber which is maintained at the same vacuum level of the processing chamber while the outgoing load lock is at a lesser vacuum level (higher pressure). By heating one wafer at a time in the heating stage, condensation is eliminated or substantially reduced, thereby eliminating potential contamination from condensation. As a result, wafer-to-wafer consistency is improved.

One embodiment is an apparatus including a first load lock, a processing chamber, and a second load lock. The first load lock is configured to be maintained at a first pressure. The processing chamber includes: a cooling stage, the cooling stage configured to cool a wafer to a first temperature prior to ion implantation, the first temperature corresponding to a cryogenic temperature; an implantation platen, the implantation platen configured to retain the wafer during an ion implantation process; and a heating stage, the heating stage configured to heat the wafer after implantation to a second temperature. The second load lock is configured to be maintained at the first pressure, where the processing chamber is configured to be maintained at a second pressure lower than the first pressure. In an embodiment, the heating stage and the implantation platen are in a continuous vacuum space, where a first vacuum level surrounding the implantation platen and a second vacuum level surrounding the heating stage are the same. In an embodiment, the processing chamber includes a first vacuum pump of a first type, where the first load lock includes a second vacuum pump of a second type different than the first type. In an embodiment, the heating stage includes: an overhead electric heater, a heated platform, or a combination thereof. In an embodiment, the implantation platen is disposed in a first subchamber of the processing chamber, where the heating stage is disposed in a second subchamber of the processing chamber, and where the second subchamber is attached to a wall of the first subchamber. In an embodiment, the second subchamber includes a cryo pump attached to the second subchamber. In an embodiment, the apparatus further includes: a robot configured to move the wafer from the first load lock to the cooling stage, to move the wafer from the cooling stage to the implantation platen, to move the wafer from the implantation platen to the heating stage, and to move the wafer from the heating stage to the second load lock. In an embodiment, the apparatus further including two or more cryo pumps for providing a first vacuum level between 100 and 1000 times greater than a second vacuum level of the second load lock. In an embodiment, the second temperature is within 10° C. of a temperature of the second load lock.

Another embodiment is a method including retrieving a wafer from a first load lock. The method also includes moving the wafer to a cooling stage. The method also includes pre-cooling the wafer to an implantation temperature, the implantation temperature being between −100° C. and −30° C. The method also includes moving the wafer to an implantation platen. The method also includes implanting ions into the wafer. The method also includes moving the wafer to a heating stage. The method also includes heating the wafer to a target temperature. The method also includes moving the wafer to a second load lock, where the first load lock and the second load lock are maintained at a first pressure, where the cooling stage, implantation platen, and heating stage, are maintained at a second pressure, where the second pressure is less than the first pressure. In an embodiment, the target temperature corresponds to an ambient temperature of the second load lock. In an embodiment, heating the wafer includes applying heat to the wafer by an overhead heater, a heated platform, or a combination thereof. In an embodiment, following implanting the ions, the wafer is moved to the heating stage without breaking vacuum of the second pressure. In an embodiment, moving the wafer to the second load lock includes passing the wafer through a valve disposed between a processing chamber housing the implantation platen and the second load lock. In an embodiment, moving the wafer to the heating stage includes passing the wafer through an opening in a sidewall of the processing chamber.

Another embodiment is a method including implanting ions into a first wafer on an implantation platen, where the first wafer has an implantation temperature between −100° C. and −30° C. during implantation. The method also includes heating the first wafer under a first vacuum on a heating stage to a target temperature between 20° C. and 50° C. The method also includes transferring the first wafer to an outgoing load lock, where the outgoing load lock is under a second vacuum, where during transferring the first wafer is free of condensation, where a first pressure level of the first vacuum is 100 to 1000 times less than a second pressure level of the second vacuum. In an embodiment, prior to implanting ions into the first wafer, first wafer is pre-cooled to the implantation temperature in a pre-cooling stage. In an embodiment, while heating the first wafer, ions are implanted into a second wafer on the implantation platen and pre-cooling a third wafer in the pre-cooling stage. In an embodiment, an ambient temperature of the outgoing load lock is within 10° C. of the target temperature. In an embodiment, the implantation platen is under a third vacuum, where a third pressure level of the third vacuum is approximate to the first vacuum.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
retrieving a wafer from a first load lock, wherein a turbo vacuum pump is attached to the first load lock to maintain a first pressure in the first load lock while retrieving the wafer from the first load lock;
moving the wafer to a cooling stage inside a processing chamber attached to a first cryo vacuum pump, the processing chamber having a second pressure that is controlled with the first cryo vacuum pump;
pre-cooling the wafer to an implantation temperature, the implantation temperature being between −100° C. and −30° C.;
moving the wafer to an implantation platen inside the processing chamber, wherein the wafer is moved through a first opening in a sidewall of the processing chamber from the cooling stage to the implantation platen;
implanting ions into the wafer;
moving the wafer through a second opening, separate from the first opening, in the sidewall of the processing chamber, to a platform of a heating stage in a sub chamber of the processing chamber, separate from the cooling stage;
heating the wafer on the platform of the heating stage, by a combination of an overhead heater poised over the wafer to apply heat to an upper surface of the wafer and heating elements of the platform to apply heat under the wafer via the platform, to an ambient temperature of a second load lock;
providing vacuum level stability in the heating stage by a second cryo vacuum pump that is separate from the first cryo vacuum pump, wherein the second cryo vacuum pump is attached to the sub chamber of the processing chamber and maintains the second pressure in the sub chamber; and
after the heating, moving the wafer from the heating stage to the second load lock, wherein the turbo vacuum pump is attached to the second load lock to maintain the first pressure in the second load lock while moving the wafer from the heating stage to the second load lock, wherein the turbo vacuum pump is disposed between the first load lock and the second load lock, wherein the cooling stage, the implantation platen, and the heating stage are maintained at the second pressure, and wherein the second pressure is less than the first pressure.

2. The method of claim 1, further comprising:
after retrieving the wafer from the first load lock, engaging the first cryo vacuum pump to lower a vacuum pressure of the processing chamber containing the implantation platen to the second pressure, wherein following implanting the ions, the wafer is moved to the heating stage inside the sub chamber of the processing chamber without breaking the vacuum pressure of the processing chamber.

3. The method of claim 1, wherein moving the wafer to the second load lock comprises passing the wafer through a valve disposed between the processing chamber and the second load lock.

4. The method of claim 1, wherein the overhead heater is an overhead coil heater, wherein the heating elements of the platform are heating coils, and wherein the wafer is heated by a combination of the overhead coil heater poised over the wafer to apply heat to the upper surface of the wafer and the heating coils of the platform to apply heat under the wafer via the platform.

5. The method of claim 1, wherein moving the wafer to the platform of the heating stage further comprises:
moving the wafer, through a slit valve, to the sub chamber of the processing chamber that comprises the heating stage.

6. A method comprising:
moving a first wafer from an incoming load lock into a processing chamber, wherein a first turbo vacuum pump is attached to the incoming load lock to place the incoming load lock under a second vacuum;
implanting ions into the first wafer on an implantation platen in the processing chamber, the processing chamber having a first vacuum provided by a first cryo vacuum pump, wherein the first wafer is pre-cooled on a cooling stage in a first sub chamber of the processing chamber;

heating the first wafer under the first vacuum on a heating stage, by a combination of an overhead coil heater poised over the first wafer to apply heat to an upper surface of the first wafer and heating coils of the heating stage to apply heat under the first wafer via the heating stage, in a second sub chamber of the processing chamber to a target temperature between 20° C. and 50° C., wherein the first vacuum is maintained by a second cryo vacuum pump that is attached to the second sub chamber in combination with the first cryo vacuum pump; and transferring, after the heating, the first wafer from the second sub chamber, through a first opening in a sidewall of the processing chamber, to the processing chamber, and through a slit valve disposed between the processing chamber and an outgoing load lock, to the outgoing load lock, wherein the first turbo vacuum pump is attached to the outgoing load lock to place the outgoing load lock under the second vacuum, wherein the first turbo vacuum pump is disposed between the incoming load lock and the outgoing load lock, and wherein the heating causes the first wafer to remain free of condensation during transferring the first wafer and in the outgoing load lock, wherein a first pressure level of the first vacuum that is 100 to 1000 times less than a second pressure level of the second vacuum, is about 1e-6 torr.

7. The method of claim 6, further comprising:
prior to implanting ions into the first wafer, pre-cooling the first wafer to an implantation temperature between −100° C. and −30° C.

8. The method of claim 7, further comprising:
simultaneously, heating the first wafer on the heating stage, implanting ions into a second wafer on the implantation platen, and pre-cooling a third wafer on the cooling stage.

9. The method of claim 6, wherein an ambient temperature of the outgoing load lock is within 10° C. of the target temperature.

10. The method of claim 6, wherein:
the implantation platen is under a third vacuum, wherein a third pressure level of the third vacuum is approximate to the first vacuum;

an ion beam generator applies an ion beam to the implantation platen;

a second turbo vacuum pump places the ion beam under a fourth vacuum, a fourth pressure level of the fourth vacuum is approximate to the second vacuum; and a third turbo vacuum pump is attached to the ion beam generator and places the ion beam generator under a fifth vacuum, a fifth pressure level of the fifth vacuum is approximate to the second vacuum, and the third turbo vacuum pump is separate from the second turbo vacuum pump.

11. The method of claim 6, wherein a coherent ion beam is directed to the first wafer to implant ions into the first wafer.

12. The method of claim 6, wherein the second cryo vacuum pump is disposed between the second sub chamber and the outgoing load lock.

13. The method of claim 12, wherein the second sub chamber is disposed between the second cryo vacuum pump and the first cryo vacuum pump.

14. A method comprising:
moving a workpiece from an incoming load lock to a cooling stage, the incoming load lock having a second pressure while moving the workpiece, wherein the second pressure is provided by a turbo vacuum pump attached to the incoming load lock;

cooling the workpiece on the cooling stage down to a first temperature, the first temperature being between −100° C. and −30° C.;

after cooling the workpiece, implanting ions into the workpiece in a processing chamber, the processing chamber having a first pressure while implanting the ions, wherein the first pressure is provided by a first cryo vacuum pump attached to the processing chamber;

after implanting the ions into the workpiece, heating the workpiece on a heating stage, separate from the cooling stage, by a combination of an overhead heater poised over the workpiece to apply heat to an upper surface of the workpiece and heating elements of the heating stage to apply heat under the workpiece via the heating stage, to an ambient temperature of an outgoing load lock, wherein the first pressure is maintained by a second cryo vacuum pump that is attached to a sub chamber that encloses the heating stage, the second cryo vacuum pump being separate from the first cryo vacuum pump; and after the heating, transporting the workpiece from the heating stage to the outgoing load lock, separate from the heating stage, wherein no additional heating of the workpiece is applied in the outgoing load lock, and wherein the outgoing load lock is maintained at the second pressure provided by the turbo vacuum pump, the turbo vacuum pump being disposed between the incoming load lock and the outgoing load lock, the second pressure being greater than the first pressure.

15. The method of claim 14, wherein the ambient temperature of the outgoing load lock is between 20° C. and 50° C.

16. The method of claim 14, wherein the workpiece is moved from the processing chamber to the heating stage without breaking a vacuum corresponding to the first pressure.

17. The method of claim 14, further comprising:
actuating a robot arm to transport the workpiece from the incoming load lock to the cooling stage.

18. The method of claim 14, wherein multiple cryo vacuum pumps including the first cryo vacuum pump and the second cryo vacuum pump are attached to the processing chamber to provide a vacuum level of 1e-6 torr in the processing chamber.

19. The method of claim 18, further comprising:
after implanting and prior to heating, moving the workpiece, through a slit valve, to the sub chamber of the processing chamber.

20. The method of claim 14, wherein the overhead heater is an overhead coil heater, wherein the heating elements of the heating stage are heating coils, and wherein the workpiece is heated by a combination of the overhead coil heater poised over the workpiece to apply heat to the upper surface of the workpiece and the heating coils of the heating stage to apply heat under the workpiece via the heating stage.

* * * * *